US011585830B2

(12) United States Patent
Reinmuth

(10) Patent No.: US 11,585,830 B2
(45) Date of Patent: Feb. 21, 2023

(54) MICROMECHANICAL Z-INERTIAL SENSOR

(71) Applicant: Robert Bosch GmbH, Stuttgart (DE)

(72) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/450,112

(22) Filed: Oct. 6, 2021

(65) Prior Publication Data

US 2022/0120781 A1 Apr. 21, 2022

(30) Foreign Application Priority Data

Oct. 15, 2020 (DE) ..................... 10 2020 212 998.3

(51) Int. Cl.
*G01P 15/125* (2006.01)
*G01P 15/08* (2006.01)

(52) U.S. Cl.
CPC ........ *G01P 15/125* (2013.01); *G01P 15/0802* (2013.01); *B81B 2201/0235* (2013.01)

(58) Field of Classification Search
CPC ....... G01P 2015/0837; G01P 2015/086; G01P 2015/0871; G01P 2015/0874; G01P 15/08; G01P 15/0802; G01P 15/125; B81B 2201/0235
See application file for complete search history.

(56) References Cited

U.S. PATENT DOCUMENTS

| | | | |
|---|---|---|---|
| 5,831,164 A * | 11/1998 | Reddi ..................... | G01P 15/18 73/514.01 |
| 8,973,439 B1 * | 3/2015 | Baldasarre ............ | G01P 15/125 73/504.12 |
| 2004/0112133 A1 | 6/2004 | Glenn et al. | |
| 2006/0144143 A1 | 7/2006 | Gogoi et al. | |
| 2012/0055249 A1 * | 3/2012 | Miyatake ............ | G01P 15/0802 73/514.32 |
| 2013/0207328 A1 | 8/2013 | Awtar et al. | |
| 2014/0345380 A1 * | 11/2014 | Jia ........................ | B81B 3/0016 73/514.32 |
| 2017/0082519 A1 | 3/2017 | Blomqvist et al. | |

FOREIGN PATENT DOCUMENTS

| | | | | |
|---|---|---|---|---|
| DE | 10051973 A1 | 5/2002 | | |
| DE | 102005059905 A1 | 6/2007 | | |
| JP | H09133708 A * | 5/1997 | | |
| WO | WO-9916129 A1 * | 4/1999 | ............. | B81B 7/007 |
| WO | WO-2010001947 A1 * | 1/2010 | ............. | G01P 15/08 |

* cited by examiner

*Primary Examiner* — Nguyen Q. Ha
(74) *Attorney, Agent, or Firm* — Norton Rose Fulbright US LLP; Gerard Messina

(57) ABSTRACT

A micromechanical z-inertial sensor. The micromechical z-inertial sensor includes at least one first seismic mass element; and torsion spring elements joined to the first seismic mass element. In each case, first torsion spring elements are connected to a substrate, and second torsion spring elements are connected to the first seismic mass element. A first and a second torsion spring element in each case is joined to one another with the aid of a lever element. The lever element is designed to strike against a stop element.

7 Claims, 5 Drawing Sheets

MICROMECHANICAL Z-INERTIAL SENSOR

FIELD

The present invention relates to a micromechanical z-inertial sensor. The present invention furthermore relates to a method for manufacturing a micromechanical z-inertial sensor.

BACKGROUND INFORMATION

A stop concept for micromechanical z-acceleration sensors is described in German Patent Application No. DE 10 2005 059 905 A1, in which stop knobs are provided on an underside of a movable structure, which strike against a stop surface, and thereby limit a movement in the z direction. A disadvantage is that several additional steps in terms of process technology are required for manufacturing such stop knobs.

Another disadvantage of the described stop concept is that a stop distance is set by the manufacturing process, which means that only stop knobs of a defined height are possible. Another disadvantage of stop knobs thus manufactured is that only a downward stop is possible. If an upward stop is also to be implemented, further added complexity in terms of process technology is required. A stop behavior of the z-acceleration sensor including the described stop knobs is defined by layer depositions or etchings, it being possible for relations between deposited layers to vary due to changing ratios, by which a stop behavior may be imprecisely defined in some circumstances.

SUMMARY

It is an object of the present invention to provide a micromechanical z-inertial sensor, avoiding the above-mentioned disadvantages.

According to a first aspect of the present invention, the object may be achieved by a micromechanical z-inertial sensor in accordance with an example embodiment, including:
  at least one first seismic mass element; and
  torsion spring elements joined to the first seismic mass element,
  in each case first torsion spring elements being connected to a substrate, and second torsion spring elements being connected to the first seismic mass element,
  a first and a second torsion spring element in each case being joined to one another with the aid of a lever element, the lever element being designed to strike against a stop element.

In this way, the lever element may advantageously be used as a stop element. In this way, a variance across the layer depositions or etchings is advantageously dispensed with for additional layer depositions. In this way, a very precise and cost-effectively providable stop concept may advantageously be implemented for the micromechanical z-inertial sensor. In particular, this dispenses with an added layer for forming knobs, as is required in the related art. Depending on the geometric design of the lever element, a stop action may be parameterized in a simple manner.

In this way, the manufacturing process advantageously does not have to be modified, but the stop behavior of the micromechanical z-inertial sensor may be implemented with the aid of design or layout. The lever element defines the ratio, by which favorable scaling of the stop behavior is supported.

Fluctuations in the layer deposition may advantageously be intercepted by the layout of the extension area of the lever element, by which ideally only a single layer deposition is required.

According to a second aspect of the present invention, the object may be achieved by a method for manufacturing a micromechanical z-inertial sensor in accordance with an example embodiment, including the steps:
  providing at least one first seismic mass element;
  providing torsion spring elements joined to the first seismic mass element,
  in each case first torsion spring elements being connected to a substrate, and second torsion spring elements being connected to the first seismic mass element,
  a first and a second torsion spring element in each case being joined to one another with the aid of a lever element, the lever element being designed to strike against a stop element.

Preferred refinements and embodiments of the micromechanical z-inertial sensor in accordance with the present invention are disclosed herein.

In one advantageous refinement of the micromechanical z-inertial sensor of the present invention, the lever element has a defined long overlap area over an orthogonal distance of the at least two torsion spring elements. In this way, a geometric lever ratio is specified, with the aid of which a stop action of the lever element may be parameterized in a simple manner.

In another advantageous refinement of the micromechanical z-inertial sensor of the present invention, each lever element has two stop areas. In this way, a stop behavior of the micromechanical z-inertial sensor may be even further enhanced since downward and upward stops are made possible by the lever elements.

In another advantageous refinement of the micromechanical z-inertial sensor of the present invention, furthermore at least one second seismic mass element is provided, the first seismic mass element, together with the second seismic mass element, being designed to be anti-parallel deflectable. In this way, a fully differential sensing concept is implemented for the micromechanical z-inertial sensor.

In another advantageous refinement of the micromechanical z-inertial sensor of the present invention, the lever element additionally includes at least one knob element. In this way, a very defined, selective stop or a small contact surface having an advantageously low adhesion force may be implemented.

In another advantageous refinement of the micromechanical z-inertial sensor of the present invention, a ratio between a distance of the first and second torsion spring elements and the extension area is designed in a defined manner. In this way, a stop characteristic may be precisely defined with the aid of the lever ratio thus specified.

In another advantageous refinement of the micromechanical z-inertial sensor of the present invention, a stop surface which is electrically insulated from the substrate is provided on the substrate, which is at the same electrical potential as the stop element. This advantageously supports that electrostatic forces between the two elements are avoided and, in the event of a strike, electrical short circuit currents which could cause a welding of the stop structure with the stop surface may be avoided.

The present invention is described in greater detail hereafter with further features and advantages based on several figures. Identical or functionally equivalent elements have identical reference numerals. The figures are, in particular, intended to illustrate the main features of the present invention and are not necessarily implemented in a manner true to scale. For the sake of improved clarity, it may be provided that not all reference numerals are shown in all figures.

Described method features result similarly from correspondingly described device features, and vice versa. This means, in particular, that features, technical advantages and statements regarding the micromechanical z-inertial sensor also apply to the method for manufacturing a micromechanical z-inertial sensor and result similarly from corresponding statements, features and advantages regarding the method for manufacturing the micromechanical z-inertial sensor, and vice versa.

DETAILED DESCRIPTION OF EXAMPLE EMBODIMENTS

For the description of geometric ratios, it is assumed hereafter that a substrate plane of the provided micromechanical z-inertial sensor extends in the xy plane, and that a seismic mass element of the provided micromechanical z-inertial sensor is deflectable in the z direction.

Figure 1:
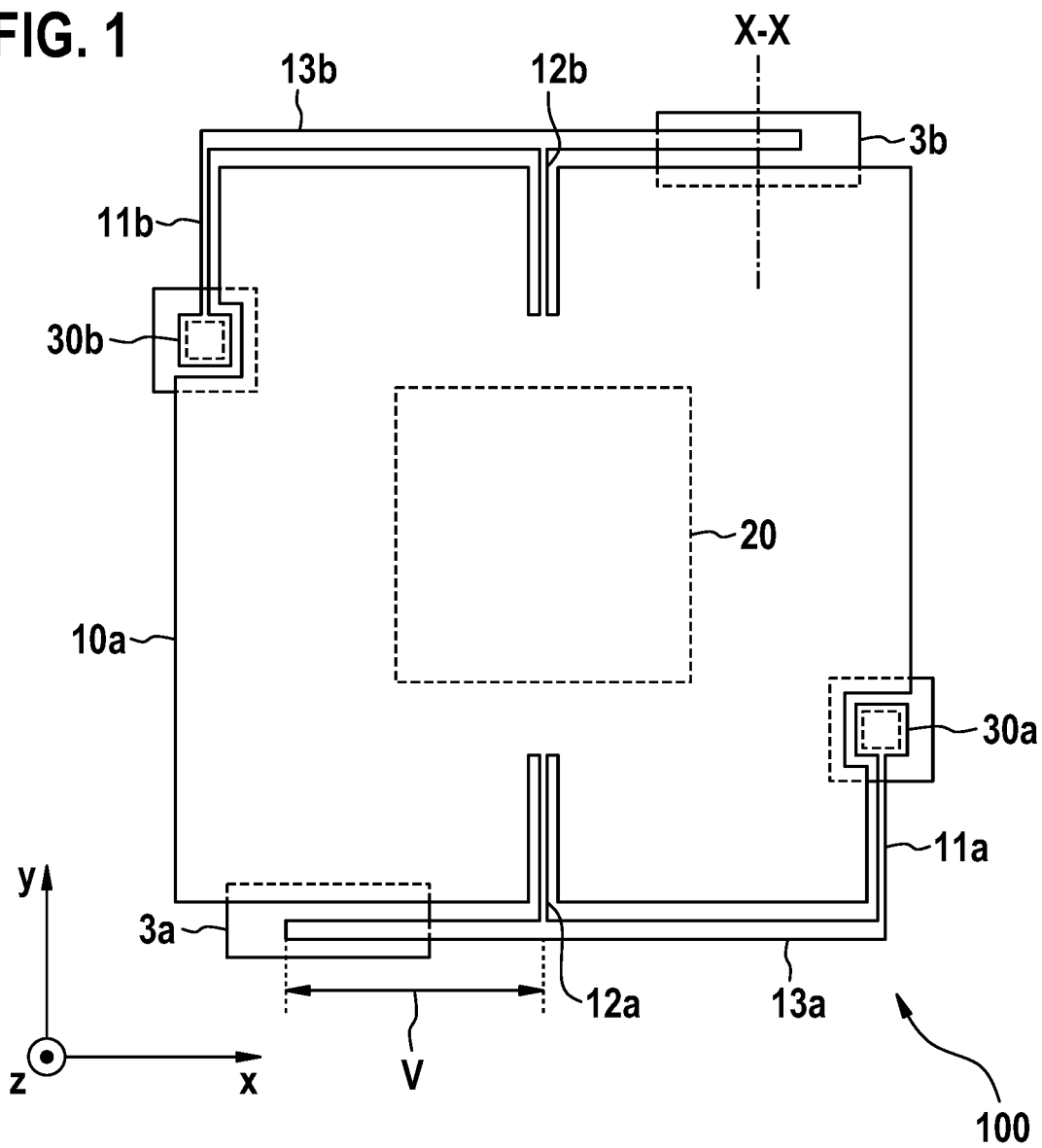
FIG. 1 shows a top view onto a first specific embodiment of a provided micromechanical z-inertial sensor, in accordance with the present invention.
Figure 1:
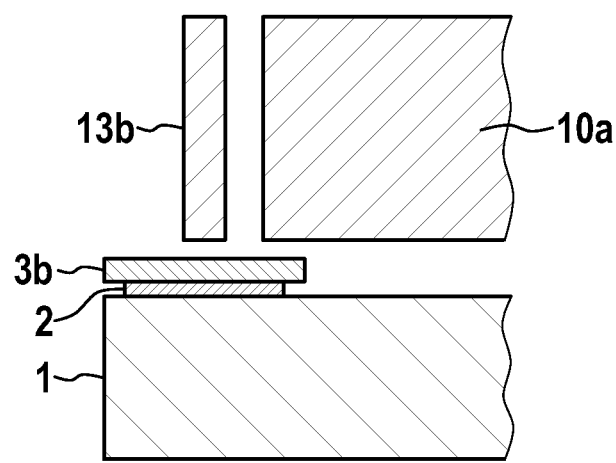

FIG. 1 shows a top view onto a first specific embodiment of a provided micromechanical z-inertial sensor 100.

A connecting element 30a is shown, with the aid of which a first seismic mass element 10a is connected to a substrate 1. First seismic mass element 10a, when subjected to an acceleration force, moves in a planar manner downward or upward in the z direction. Proceeding from connecting element 30a, a first torsion spring element 11a is shown, which during a deflection of first seismic mass element 10a is twistable about the y axis in parallel to the xy axis.

Furthermore, a lever element 13a acting as a stop element is provided for micromechanical z-inertial sensor 100, lever element 13a being connected with the aid of first torsion spring element 11a through 11n to substrate 1, and with the aid of a second torsion spring element 12a through 12n to first seismic mass element 10a. It is apparent that lever element 13a includes an extension area V beyond second torsion spring element 12a through 12n, a stop surface 3a for striking of the lever element 13a downward before striking against first seismic mass element 10a being provided in extension area V on substrate 1. It would also be possible to design lever element 13a for striking upward (not shown). During a deflection of first seismic mass element 10a out of the xy plane, the two torsion spring elements 11a, 12a thus twist in opposite directions.

A detail sectional view X-X shows, in principle, the option of lever element 13b striking against stop surface 3b, which is situated on an oxide layer 2. The stop surfaces may be placed at any arbitrary electrical potential due to their electrical separation from substrate 1. It is particularly favorable in the process to place the stop surface at the same electrical potential as the stop structure, on the one hand to avoid electrostatic forces between the two elements and, on the other hand, to avoid electrical short circuit currents in the event of a strike, which could cause a welding of the stop structure with the stop surface.

Fixed electrode 20 or stop surfaces 3a through 3n may be implemented in the form of a buried polysilicon layer in the process.

With the aid of a geometric lever ratio, i.e., a ratio between a distance of the two torsion spring elements 11a through 11n, 12a through 12n and an extension area V, the stop point of first movable mass element 10a with respect to a fixed electrode 20 may thus be set. In the process, both extension area V and the distance between torsion spring elements 11a through 11n, 12a through 12n may be used as a variable parameter.

For different movable mass elements or different points of the movable mass elements, it is possible in this way to generate different stop heights via the lever ratio, without having to carry out interventions in the manufacturing process. In this way, a stop characteristic of micromechanical z-inertial sensor 100 may advantageously be symmetrized with the aid of a lever ratio. In the process, the ratio between the distance of torsion spring elements 11a through 11n, 12a through 12n for the dimensioning of extension area V is crucial.

It is furthermore provided to extend the lever structure between second torsion spring element 12a and first torsion spring element 11a in the direction of first torsion spring element 11a, and to provide a stop surface 3a at substrate 1 in the area of the further, additional extension. In this way, the stop point or the stop height of the movable heavy first seismic mass element 10a in the z direction may advantageously be established via the lever ratio.

In a particularly favorable variant, the stop surface is manufactured in the manufacturing process together with fixed electrode 20 and is at the same electrical potential as movable first seismic mass element 10a. Advantageously, no additional steps are required during the manufacturing process, and the stop surface may be maintained at a defined electrical potential, in particular, at the same electrical potential as movable mass element 10a, no electrostatic force being exerted on movable mass element 10a by the stop structure.

Figure 2:
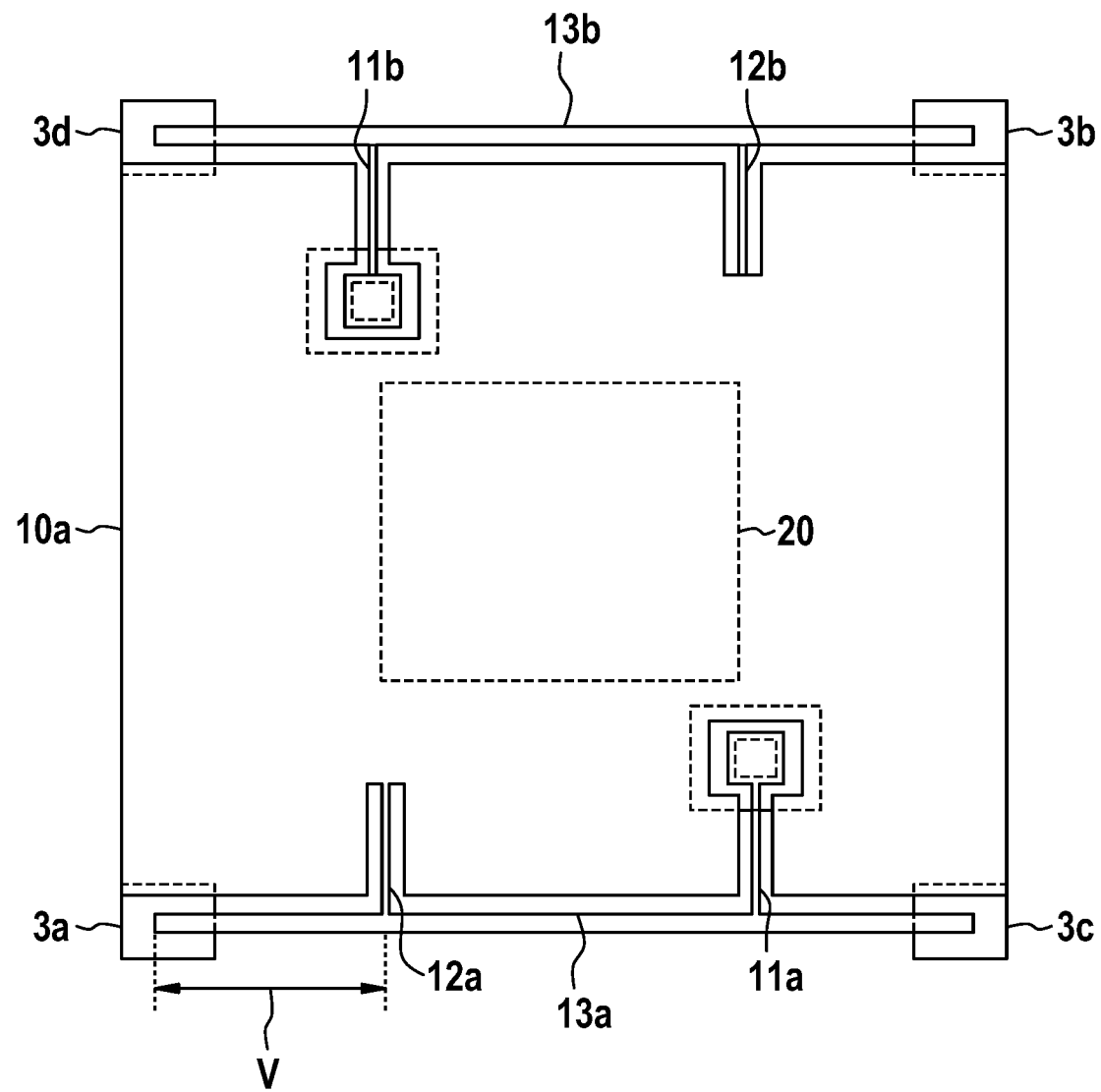
FIG. 2 shows a top view onto a second specific embodiment of a provided micromechanical z-inertial sensor, in accordance with the present invention.

FIG. 2 shows a top view onto a second specific embodiment of the provided mechanical z-inertial sensor 100 including downward and upward stops. In this case, both lever elements 13a, 13b are in each case designed to strike against two stop surfaces 3a through 3d.

For MEMS elements including movable second seismic mass elements 10b which are coupled anti-parallel to one another in their movement, it may be favorable to use a shared lever structure in each case for two movable mass elements 10b, a first second mass element 10b being situated via the second spring on a first side of the first spring element, and a second lightweight mass element 10b being situated with the aid of a third spring on the second side of the lever-like connecting element 13a. In this way, two lightweight mass elements 10b situated diagonally with respect to one another in each case deflect downward in the z direction, and two lightweight mass elements 10b situated diagonally with respect to one another deflect upward in the z direction ("anti-parallel deflection").

Figure 3:
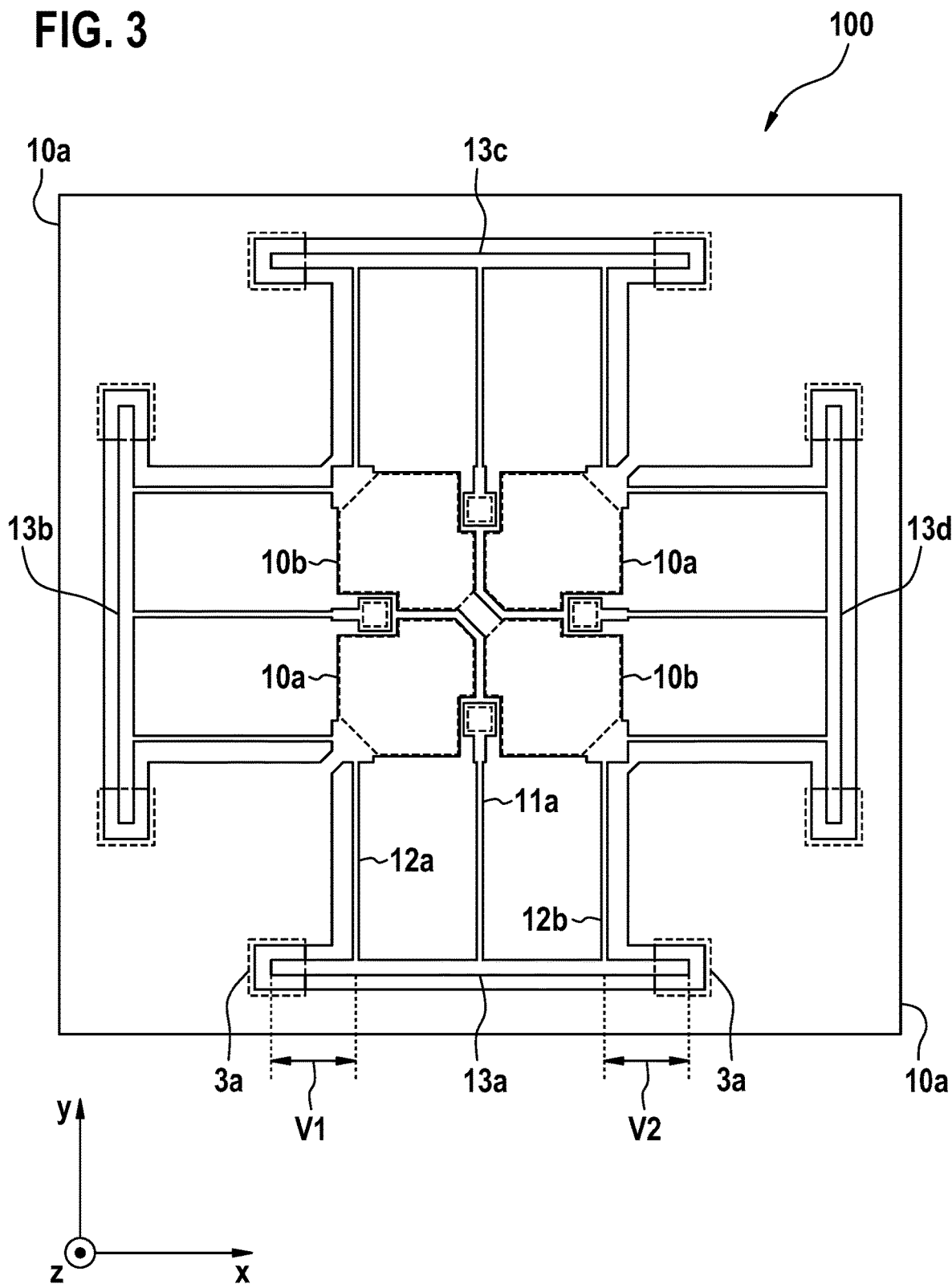
FIG. 3 shows a top view onto a third specific embodiment of a provided micromechanical z-inertial sensor, in accordance with the present invention.

FIG. 3 shows such an arrangement in which a respective extension area V is provided in both end sections of lever element 13a through 13d, a respective stop surface 3a being provided at substrate 1 below extension area V. It is apparent that first seismic mass elements 10a include an area extending around the outside, whereas second seismic mass elements 10b, which are not joined to first seismic mass element 10a, are provided in the central area.

In this way, a fully differential sensing concept may advantageously be implemented using seismic mass elements 10a, 10b for z-inertial sensor 100 which are designed to be deflectable in such an anti-parallel manner. Each of lever elements 13a through 13d to a certain extent forms a rocker structure, which are connected to the two seismic mass elements 10a, 10b with the aid of three respective torsion spring elements 11a, 12a, 12b. In the process, each of lever elements 13a through 13d forms a rocker which is able to move about torsion spring element 11a as the torsion axis in a rocker-like manner, by which torsion spring elements 12a, 12b are twisted in opposite directions, and in this way cause lever element 13a to strike against one of stop surfaces 3a, even before one of seismic mass elements 10a, 10b is able to strike.

In this arrangement, the rocker-like lever element 13a through 13d is thus used in two ways, and consequently is particularly space-saving. In the process, a first projecting extension area V1 serves as a stop protection of first seismic mass element 10a with respect to the electrode. The same applies in reverse assignment to a second projecting extension area V2.

The structure and operating principle of lever element 13a was described above by way of example. However, it shall be understood that lever elements 13b, 13c and 13d are designed similarly to lever element 13a. It is apparent that, using the provided structure, it is possible in a simple manner with the aid of a design of extension areas V1, V2 to specify a stop behavior of lever elements 13a through 13d of micromechanical z-inertial sensor 100.

It is furthermore apparent in the specific embodiment shown in FIG. 3 that both the suspension and the stops of the two seismic mass elements 10a, 10b are implemented by similar lever elements 13a through 13d, by which a particularly small and robust z-inertial sensor 100 may advantageously be implemented. The shared use of torsion spring elements 11a, 12a, 12b for the suspension and stop of lever arm 13a allows torsion spring elements 11a, 12a, 12b to be designed to be particularly robust.

Figure 4:
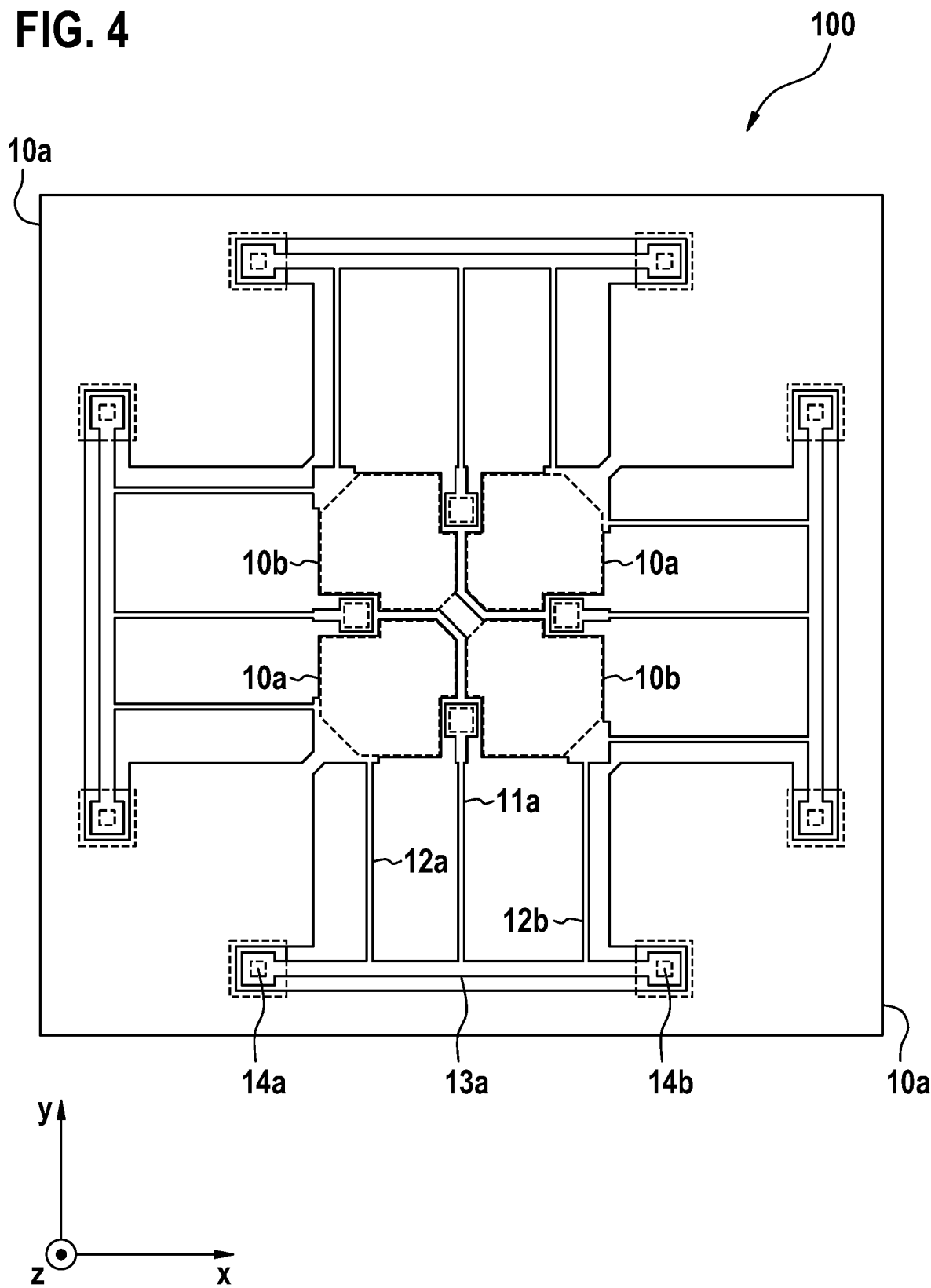
FIG. 4 shows a top view onto a fourth specific embodiment of a provided micromechanical z-inertial sensor, in accordance with the present invention.

In the variant of micromechanical z-inertial sensor 100 of FIG. 4, it is shown that the area of lever element 13a connected to the more lightweight second seismic mass element 10b is longer than that connected to the heavier first seismic mass element 10a. The heavier first seismic mass element 10a is richer in mass and larger than the second more lightweight seismic mass element 10b, and is thus deflected more strongly during acceleration, and torsion spring element 12b of the heavier first seismic mass element 10a also bends more strongly under load due to the larger mass. It is advantageous in the process that the stop may be set in such a way that it is active earlier for the heavier first seismic mass element 10a.

For MEMS inertial sensors 100 in which the stop surfaces are to be kept particularly small, or for MEMS sensors in which the stop surfaces are undercut, it may be favorable to additionally provide knob elements 14a through 14n to obtain a very locally defined stop.

The arrangement of FIG. 4 shows such a variant of a micromechanical z-inertial sensor 100. Even though added complexity in terms of process technology is required for manufacturing knob elements 14a through 14n, all above-described advantages of the provided concept remain, except for the added costs caused thereby. In this way, it is possible to implement very defined, selective stops having small contact surfaces for the provided micromechanical z-inertial sensor 100, which advantageously only generate a low adhesion force.

In summary, the present invention provides a stop concept for micromechanical z-inertial sensors, which in particular has the following advantages:
  easy implementability with little added complexity during the manufacturing process
  enabling different stop distances within a MEMS chip
  enabling stops in two directions
  implementation of a stop having a stop height which scales with the distance between the movable mass and fixed electrode.

Figure 5:
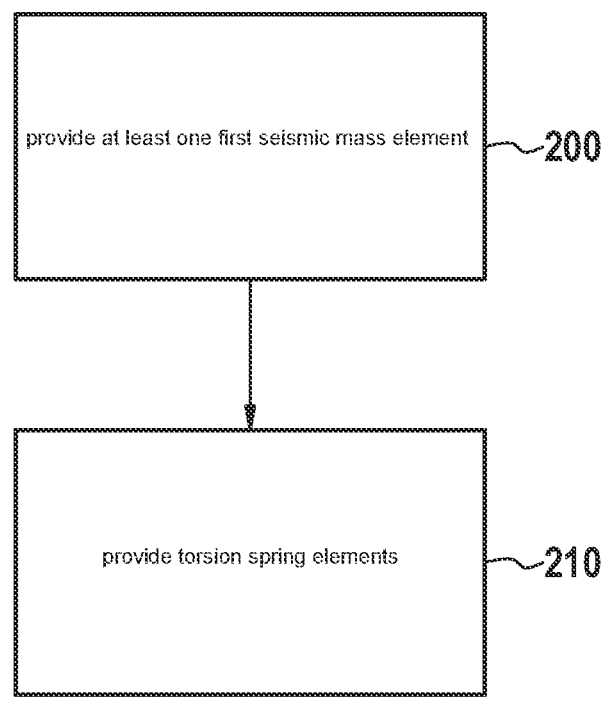
FIG. 5 shows a schematic sequence of a method for manufacturing a provided micromechanical z-inertial sensor, in accordance with an example embodiment of the present invention.

FIG. 5 shows a schematic sequence of the provided method for manufacturing a provided micromechanical z-inertial sensor 100.

In a step 200, at least one first seismic mass element 10a is provided.

In a step 210, torsion spring elements 11a through 11n, 12a through 12n joined to first seismic mass element 10a are provided, in each case first torsion spring elements 11a through 11n being connected to a substrate 1 and second torsion spring elements 12a through 12n being connected to first seismic mass element 10a, a first and second torsion spring element 11a through 11n, 12a through 12n in each case being joined to one another with the aid of a lever element 13a through 13n, lever element 13a through 13n being designed to strike against a stop element 3a through 3n.

It shall be understood that the sequence of the described steps may also be interchanged in a suitable manner.

Advantageously, it is possible, for example, to combine high-g and low-g MEMS sensors in a simple manner on a single chip using the provided concept, it being possible for different extension areas V, V1, V2 of lever elements 13a through 13n to be provided for the individual sensors.

The provided approach may also be used for other types of micromechanical z-sensors, for example for z-sensors which operate with an upper electrode, or with ASICAp approaches in which an electrode is also provided on the ASIC side.

Although the present invention has been described above based on specific exemplary embodiments, those skilled in the art may implement specific embodiments which are not provided or only partially provided above, without departing from the core of the present invention.

What is claimed is:

1. A micromechanical z-inertial sensor, comprising:
  at least one first seismic mass element; and
  torsion spring elements joined to the first seismic mass element, first torsion spring elements of the torsion spring elements being connected to a substrate, and second torsion spring elements of the torsion spring elements being connected to the first seismic mass element;
  wherein each of the first torsion spring elements is joined to a respective one of the second torsion spring elements using a corresponding lever element, each of the lever elements being configured to strike against a stop element,
  wherein each of the lever elements has an overlap area defined over an orthogonal distance between the first and second torsion spring elements, so that a geometric lever ratio is specified, by which a stop action of the lever element is parameterized, wherein each of the lever elements has two stop areas, so that a stop behavior of the micromechanical z-inertial sensor includes downward and upward stops as enabled by each of the lever elements, wherein for different movable mass elements or different points of the movable mass elements, different stop heights can be generated via the lever ratio, so that a stop characteristic of the micromechanical z-inertial sensor is symmetrized with the lever ratio, and wherein it is provided to extend the lever structure between the second torsion spring element and the first torsion spring element in a direction of the first torsion spring element, and to provide a stop surface at the substrate in an area of a further extension, so that the stop point or the stop height of the movable first seismic mass element in the z direction is established via the lever ratio.

2. The micromechanical z-inertial sensor as recited in claim 1, further comprising:

at least one second seismic mass element, the first seismic mass element, together with the second seismic mass element, being configured to be anti-parallel deflectable.

3. The micromechanical z-inertial sensor as recited in claim 1, wherein each of the lever elements includes at least one respective knob element.

4. The micromechanical z-inertial sensor as recited in claim 1, wherein a ratio between a distance of the first and second torsion spring elements and an extension area of each of the lever elements is configured in a defined manner.

5. The micromechanical z-inertial sensor as recited in claim 1, wherein a stop surface which is electrically insulated from the substrate is provided on the substrate, which is at the same electrical potential as the stop element.

6. A method for manufacturing a micromechanical z-inertial sensor, the method comprising:

providing at least one first seismic mass element; and providing torsion spring elements joined to the first seismic mass element, first torsion spring elements of the torsion spring elements being connected to a substrate, and second torsion spring elements of the torsion spring elements being connected to the first seismic mass element;

wherein each of the first torsion spring elements is joined to a respective one of the second torsion spring element using a corresponding lever element, each of the lever elements being configured to strike against a stop element, wherein each of the lever elements has an overlap area defined over an orthogonal distance between the first and second torsion spring elements, so that a geometric lever ratio is specified, by which a stop action of the lever element is parameterized, and wherein each of the lever elements has two stop areas, so that a stop behavior of the micromechanical z-inertial sensor includes downward and upward stops as enabled by each of the lever elements, wherein for different movable mass elements or different points of the movable mass elements, different stop heights can be generated via the lever ratio, so that a stop characteristic of the micromechanical z-inertial sensor is symmetrized with the lever ratio, and wherein it is provided to extend the lever structure between the second torsion spring element and the first torsion spring element in a direction of the first torsion spring element, and to provide a stop surface at the substrate in an area of a further extension, so that the stop point or the stop height of the movable first seismic mass element in the z direction is established via the lever ratio.

7. The method as recited in claim 6, wherein at least one knob element is situated on each of the lever elements.

* * * * *